US012733498B2

(12) United States Patent
Kang et al.

(10) Patent No.: US 12,733,498 B2
(45) Date of Patent: Sep. 8, 2026

(54) DIRECT COOLING DEVICE FOR INTEGRATED CIRCUIT AND MANUFACTURING METHOD THEREOF

(71) Applicant: CHUNG-ANG UNIVERSITY INDUSTRY ACADEMIC COOPERATION FOUNDATION, Seoul (KR)

(72) Inventors: Min Soo Kang, Seoul (KR); Jun Rae Park, Ansan-si (KR); Hae Cheon Kim, Daejeon (KR); Hyoung Soon Lee, Seoul (KR); Sung Jae Chang, Daejeon (KR); Hyun Wook Jung, Daejeon (KR); Il Gyu Choi, Jeonju-si (KR); Seong Il Kim, Daejeon (KR); Sang Heung Lee, Daejeon (KR); Ho Kyun Ahn, Daejeon (KR); Jong Won Lim, Daejeon (KR)

(73) Assignee: CHUNG-ANG UNIVERSITY INDUSTRY ACADEMIC COOPERATION FOUNDATION, Seoul (KR)

( * ) Notice: Subject to any disclaimer, the term of this patent is extended or adjusted under 35 U.S.C. 154(b) by 369 days.

(21) Appl. No.: 18/432,046

(22) Filed: Feb. 4, 2024

(65) Prior Publication Data

US 2024/0266253 A1 Aug. 8, 2024

(30) Foreign Application Priority Data

Feb. 3, 2023 (KR) ........................ 10-2023-0014774

(51) Int. Cl.
*H10W 40/47* (2026.01)
*H10W 70/63* (2026.01)

(52) U.S. Cl.
CPC ......... *H10W 40/47* (2026.01); *H10W 70/635* (2026.01)

(58) Field of Classification Search
CPC ... H10W 40/47; H10W 70/635; H10W 20/20; H10W 40/037; H10W 40/22; H10W 40/258
See application file for complete search history.

(56) References Cited

U.S. PATENT DOCUMENTS 10,334,756 B1 * 6/2019 Dede .................. H05K 7/20272
2018/0166359 A1 * 6/2018 Fukuoka ............... H10W 40/22
(Continued)

FOREIGN PATENT DOCUMENTS

JP 2021-068844 A 4/2021

*Primary Examiner* — Yasser A Abdelaziez
(74) *Attorney, Agent, or Firm* — Bridgeway IP Law Group, PLLC; Sang Ho Lee; Hyun Woo Shin

(57) ABSTRACT

Provided is a direct cooling device for an integrated circuit configured to form a direct cooling portion with a flow channel through which cooling fluid may flow in a through via hole of a substrate constituting the integrated circuit, and to couple the substrate to a heat sink unit through a bonding portion formed integrally with the direct cooling portion, unlike the prior art in which only a ground circuit is possible through the through via hole, which derives the effect of increasing product reliability due to improved thermal management efficiency of the integrated circuit by directly cooling the semiconductor device as well as the ground circuit, and the effect of simplifying and miniaturizing the structure by implementing the cooling function using a circuit for grounding the semiconductor device even without forming an additional flow path structure for cooling the semiconductor device.

7 Claims, 8 Drawing Sheets

(56) References Cited

U.S. PATENT DOCUMENTS

2019/0371705 A1* 12/2019 Yamauchi ............. H02M 7/003
2023/0019930 A1* 1/2023 Yoo .................... H05K 7/20236
2023/0361000 A1* 11/2023 Lee ...................... H10W 40/22

* cited by examiner

DIRECT COOLING DEVICE FOR INTEGRATED CIRCUIT AND MANUFACTURING METHOD THEREOF

CROSS-REFERENCE TO RELATED APPLICATIONS

This application claims the priority of Korean Patent Application No. 10-2023-0014774 filed on Feb. 3, 2023, in the Korean Intellectual Property Office, the entire contents of which is incorporated herein by reference.

TECHNICAL FIELD

The present disclosure relates to a direct cooling device for an integrated circuit, and more particularly, to a direct cooling device for an integrated circuit with improved structure and process so as to improve thermal management efficiency by using a through via hole for forming a ground circuit of a semiconductor device constituting an integrated circuit, and a manufacturing method thereof.

In addition, the present disclosure is the future challenge defense technology research and development (Project No. UI220007TD, No. 915028201) conducted with the support of the Agency for Defense Development of the Republic of Korea with funding from the Government (Defense Acquisition Program Administration) for a period of Jan. 3, 2022 to Nov. 30, 2026 (59 months).

Project Details

[Ministry Name] Defense Acquisition Program Administration

[Research Management Specialized Institution] Agency for Defense Development

[Research Project Name] Future challenge defense technology research and development project

[Research period] Jan. 3, 2022 to Nov. 30, 2026 (59 months)

[Project name/Project number] Research and development of high-power GaN device with self-heat dissipation function (No. 915028201)

BACKGROUND ART

Due to the heat generated during operation of electronic/electrical devices, the overall device performance is reduced and reliability problem frequently occurs.

In particular, for implementation of performance of high-performance devices, because ultra-small integrated circuits in which a large number of active elements (e.g. transistors) and passive elements (e.g. diodes, condensers, resistors, etc.) are integrated on a single semiconductor substrate are used, thermal management has an absolute effect on the reliability and maximum performance of devices. Therefore, in order to improve thermal management efficiency, a change in the design of a package structure constituting the existing integrated circuit is required.

DISCLOSURE

Technical Problem

The present disclosure is directed to providing a direct cooling device for an integrated circuit, which enables direct cooling of a semiconductor device as well as a ground circuit by using a through via hole in the integrated circuit.

Technical Solution

In one aspect of the present disclosure, there is provided a direct cooling device for an integrated circuit including a substrate made of a material capable of manufacturing a semiconductor device, having the semiconductor device formed on one side thereof through a semiconductor process, and including a through via hole formed by penetrating the one side and the other side located opposite to the one side so that a source terminal of the semiconductor device is exposable to the other side; a packaging block disposed at a position spaced apart from the substrate for packaging the semiconductor device, and having an electrode electrically connected to a gate terminal and a drain terminal of the semiconductor device through wiring and placed thereon to be insulated; a heat sink unit disposed on a lower side of the packaging block and having a fluid movement region formed at a position corresponding to the through via hole of the substrate; and a metal thin film layer including a bonding portion made of a conductive material and disposed between the substrate and the heat sink unit for electrical connection and physical coupling between the substrate and the heat sink unit, and a direct cooling portion conductively connected to the bonding portion, disposed in the through via hole to enable electrical connection between the bonding portion and the source terminal, and having a flow channel communicating with the fluid movement region of the heat sink unit.

The direct cooling portion of the metal thin film layer may have a porous structure.

The direct cooling device may further include a preform disposed between the metal thin film layer and the heat sink unit for coupling between the metal thin film layer and the heat sink unit.

The heat sink unit may include a flow path forming portion in which the fluid movement region is formed, and, in the flow path forming portion, an inflow line until a cooling fluid flows into the flow channel of the substrate and a discharge line until the cooling fluid is discharged after flowing into the flow channel may be formed to be partitioned from each other, so that the cooling fluid flowing into the inflow line may be configured to pass through the flow channel of the metal thin film layer without being directly discharged to the discharge line, and the fluid movement region located in a region corresponding to the flow channel among the inflow line and the discharge line may include the inflow region and the discharge region that are partitioned from each other with a partition portion therebetween.

In another aspect of the present disclosure, there is provided a method of manufacturing a direct cooling device for an integrated circuit including a device and substrate preparation step of stacking a material layer for forming a semiconductor device on one surface of a substrate made of a material including silicon, performing a semiconductor process on the material layer, forming the semiconductor device, and forming a through via hole penetrating the one side and the other side located opposite to the one side so that a source terminal of the semiconductor device is exposable to the other side; a heat sink unit preparation step of disposing a heat sink unit including a flow path forming portion in which a fluid movement region communicating with the through via hole of the substrate is formed on a lower side of the substrate; a wiring step of disposing a packaging block in the heat sink unit in the form that surrounds the substrate for packaging the semiconductor device, and electrically connecting an electrode placed on the packaging block to a gate terminal and a drain terminal of the semiconductor device; a metal thin film layer forming step of forming a metal thin film layer between the substrate and the heat sink unit for electrical connection and physical coupling between the substrate and the heat sink unit, forming a bonding portion of the metal thin film layer between the substrate and the heat sink unit, and forming, in the through via hole, a direct cooling portion integrally formed the bonding portion and in which a flow channel communicating with the fluid movement region of the heat sink unit is formed; and a coupling step of coupling the substrate to the heat sink unit by coating a side of the heat sink unit opposite to the substrate with metal and then applying heat.

The coupling step may include a process of coating the metal on the side of the heat sink unit opposite to the substrate, before applying heat, disposing a preform including the coated metal material, and then applying heat, to couple the substrate to the heat sink unit by using the preform through a eutectic bonding process.

Advantageous Effects

The direct cooling device for the integrated circuit according to the present disclosure having the above-described configuration is configured to form the direct cooling portion with the flow channel through which cooling fluid may flow in the through via hole of the substrate constituting the integrated circuit, and to couple the substrate to the heat sink unit through the bonding portion formed integrally with the direct cooling portion, unlike the prior art in which only a ground circuit is possible through the through via hole, which derives the effect of increasing product reliability due to improved thermal management efficiency of the integrated circuit by directly cooling the semiconductor device as well as the ground circuit, and the effect of simplifying and miniaturizing the structure by implementing the cooling function using a circuit for grounding the semiconductor device even without forming an additional flow path structure for cooling the semiconductor device.

BEST MODE

Figure 1:
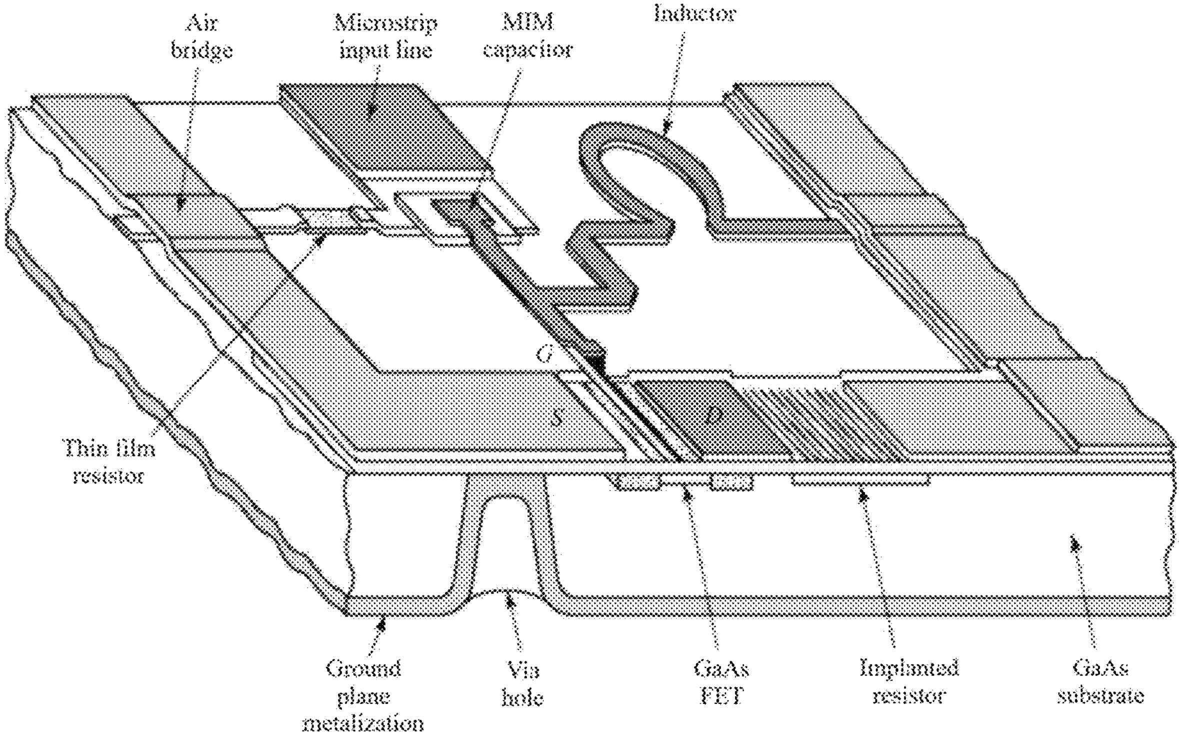
FIG. 1 is a diagram for explaining a through via hole in a general integrated circuit.

In order to clarify the understanding of the present disclosure in the following description, descriptions of well-known technology of the features of the present disclosure will be omitted. The following embodiments are detailed descriptions to help the understanding of the present disclosure, and do not to limit the scope of the present disclosure. Accordingly, equivalent inventions performing the same functions as those of the present disclosure will also fall within the scope of the present disclosure.

In addition, in the following description, the same reference numeral mean the same configuration, and unnecessary redundant descriptions and descriptions of well-known technologies will be omitted. In addition, the description of each embodiment of the present disclosure that overlaps with the description of the technology that is the background of the invention will also be omitted.

Hereinafter, a direct cooling device for an integrated circuit according to an embodiment of the present disclosure will be described in detail with reference to the accompanying drawings.

Figure 2:
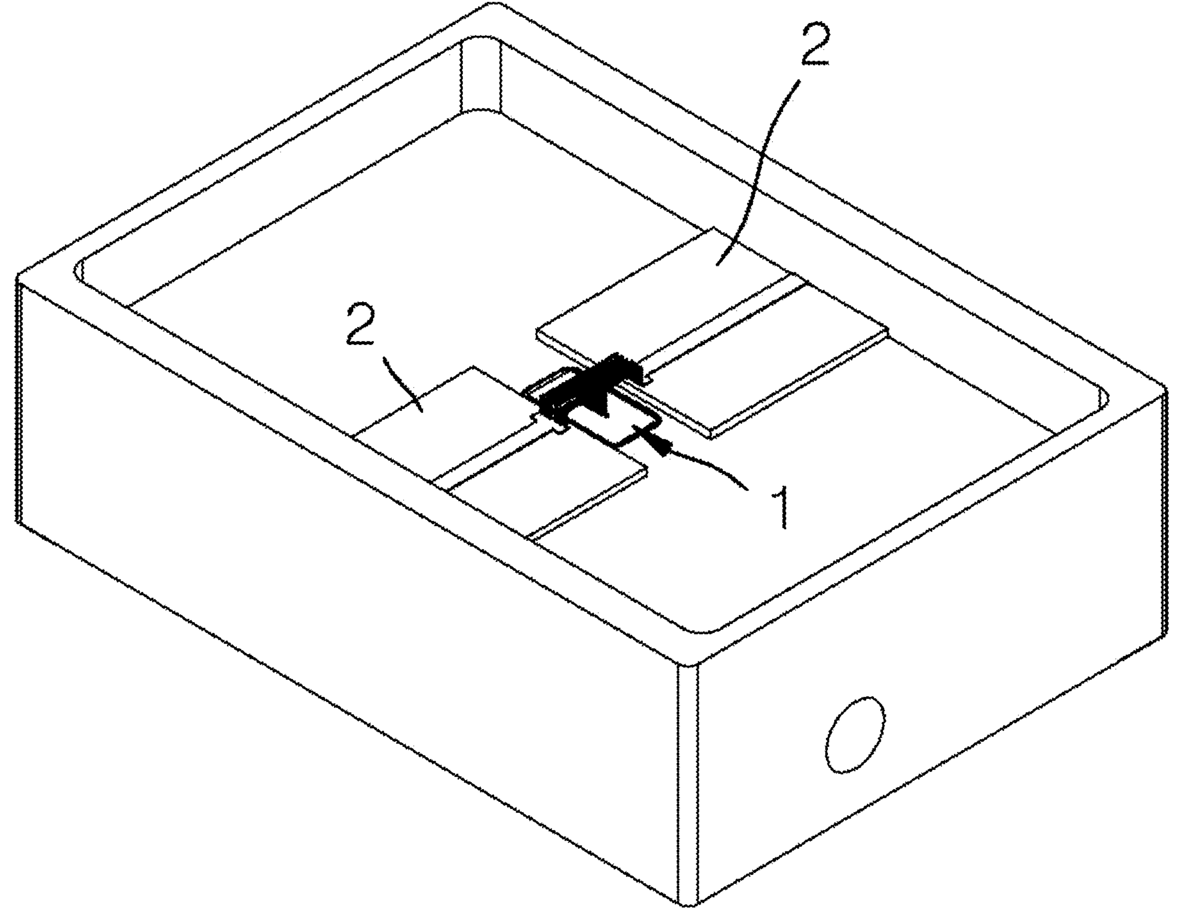
FIG. 2 is a perspective view of a direct cooling device for an integrated circuit according to an embodiment of the present disclosure.
Figure 3:
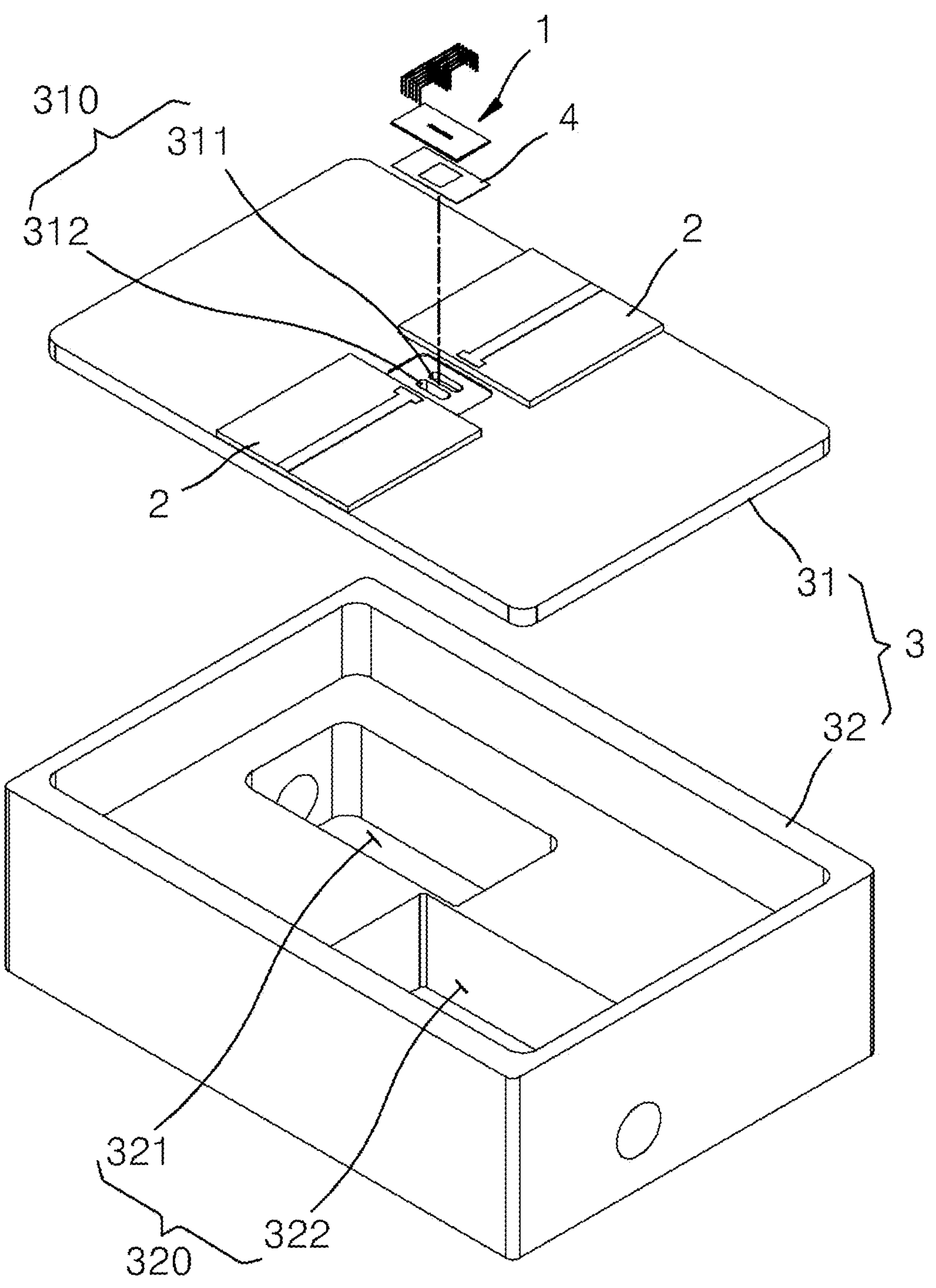
FIG. 3 is an exploded perspective view of an embodiment of the present disclosure.
Figure 4:
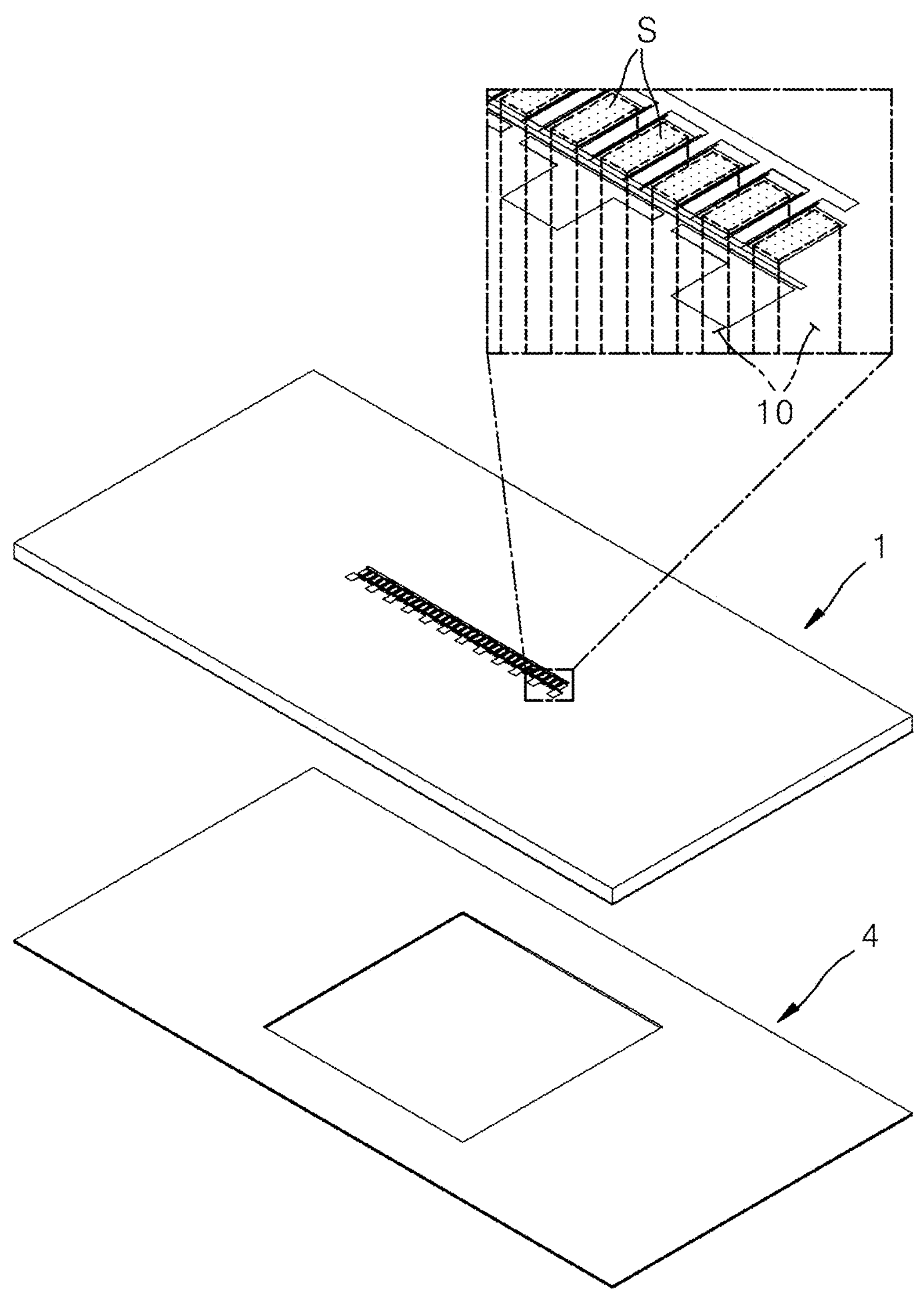
FIG. 4 is a diagram for explaining configurations of a substrate and a preform employed in an embodiment of the present disclosure.
Figure 5:
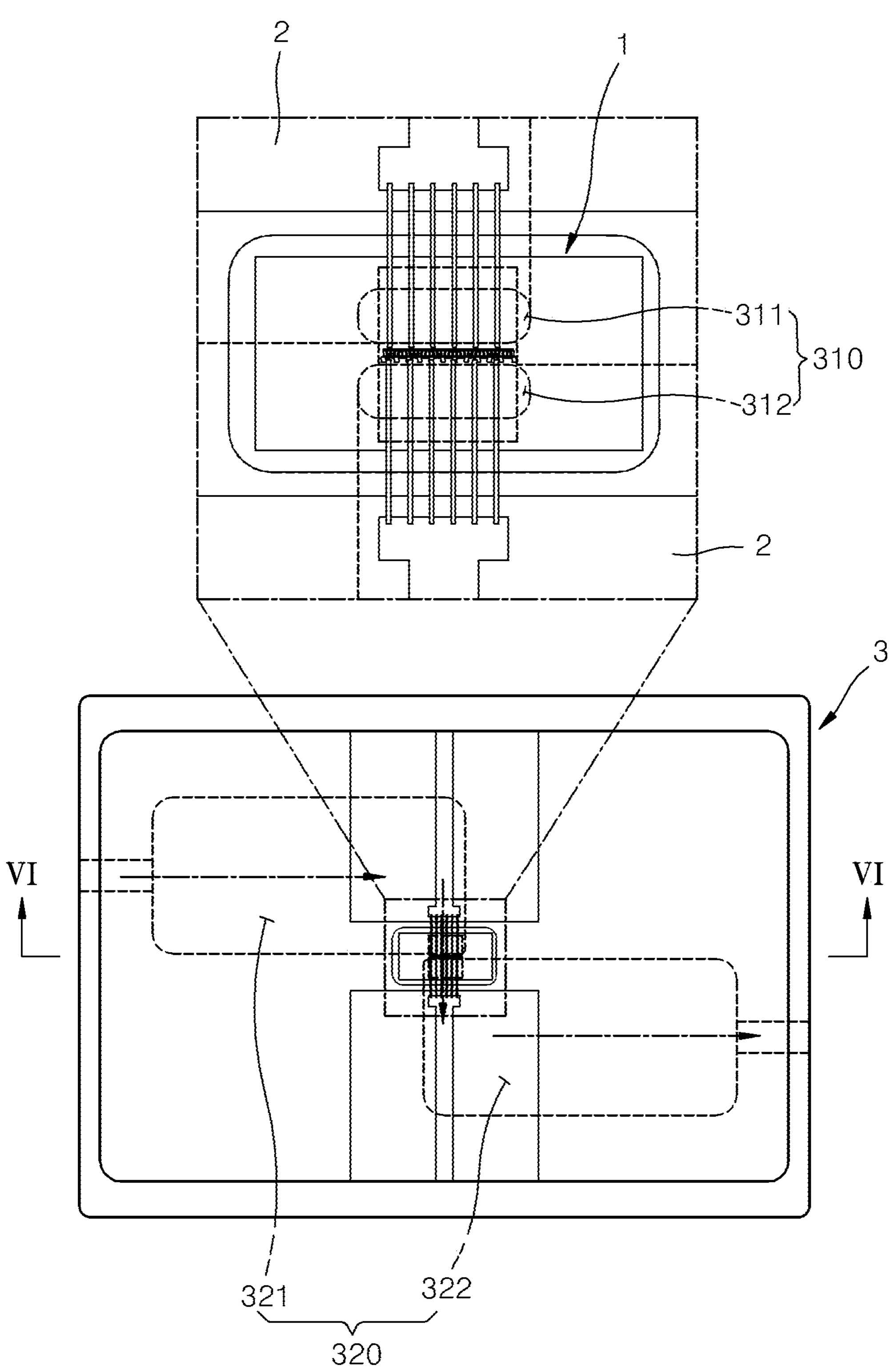
FIG. 5 is a plan view of an embodiment of the present disclosure.
Figure 6:
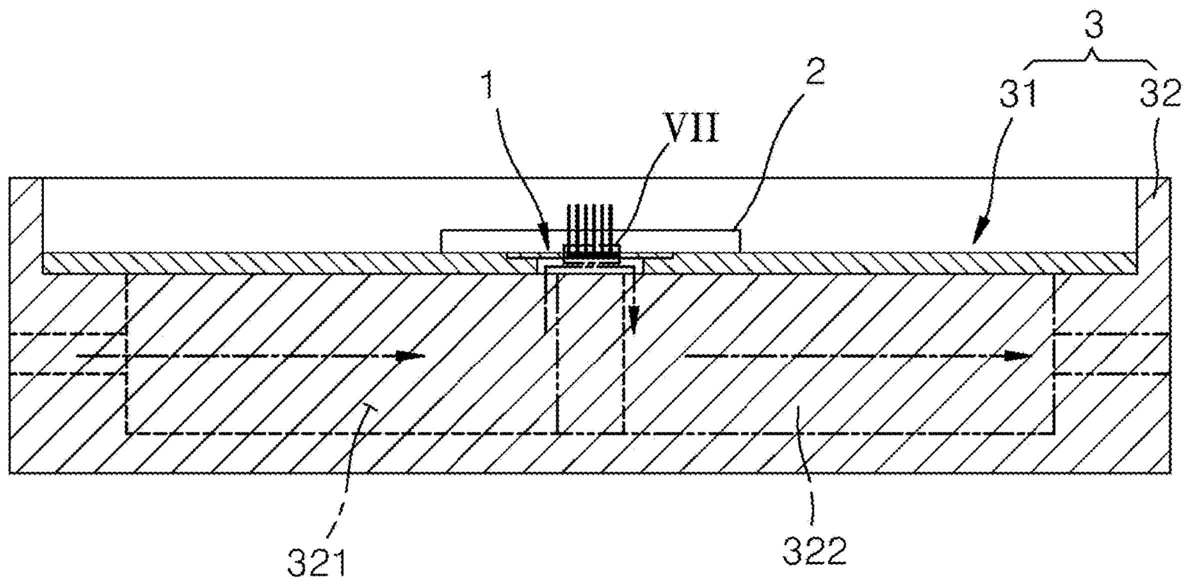
FIG. 6 is a cross-sectional view taken along line VI-VI of FIG. 5.
Figure 7:
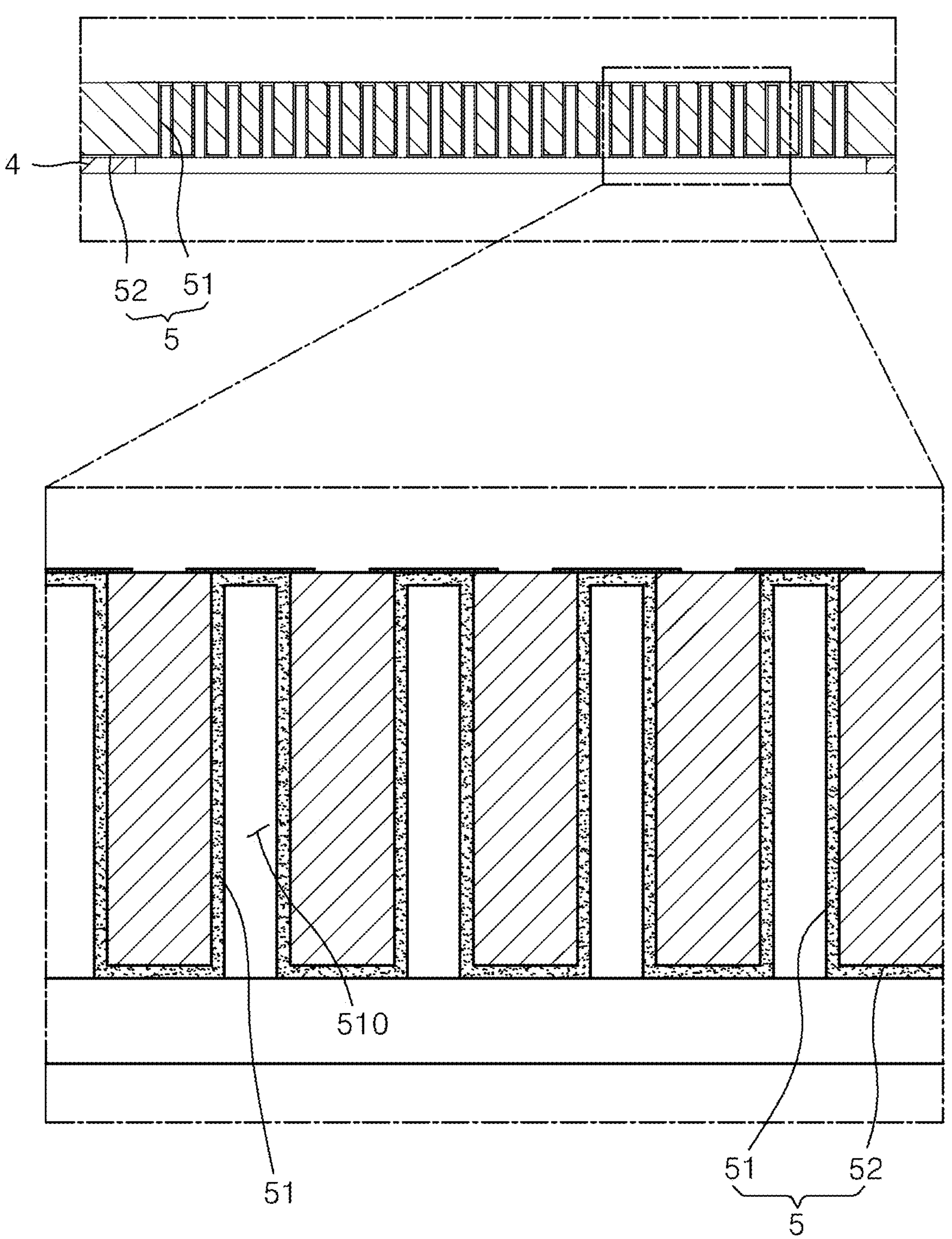
FIG. 7 is an enlarged view of a region VII of FIG. 6.

FIG. 2 is a perspective view of a direct cooling device for an integrated circuit according to an embodiment of the present disclosure. FIG. 3 is an exploded perspective view of an embodiment of the present disclosure. FIG. 4 is a diagram for explaining configurations of a substrate and a preform employed in an embodiment of the present disclosure. FIG. 5 is a plan view of an embodiment of the present disclosure. FIG. 6 is a cross-sectional view taken along line VI-VI of FIG. 5. FIG. 7 is an enlarged view of a region VII of FIG. 6.

As shown in FIGS. 2 and 3, the direct cooling device for the integrated circuit according to an embodiment of the present disclosure enables direct cooling of a semiconductor device and a ground circuit by using a through via hole 10 (see FIG. 4) of the integrated circuit, and includes a substrate 1, a packaging block 2, a heat sink unit 3, and a thin metal film layer 5.

The substrate 1 corresponds to a wafer for manufacturing the semiconductor device, is made of a material capable of manufacturing the semiconductor device, such as Si or SiC, has the semiconductor device formed through a semiconductor process on one side thereof, and, as well shown in FIG. 4, includes a through via hole 10 formed by penetrating the one side and the other side located opposite to the one side, so that a source terminal S of the semiconductor device is exposable to the other side.

The substrate 1 employed in the present embodiment is configured to be integrally formed of a single material including silicon, but the present disclosure is not limited thereto, and, for example, may also be configured in a structure in which a base layer for forming the semiconductor device and a channel layer for forming a flow channel 510 of a cooling fluid are separately manufactured and then coupled to each other.

The packaging block 2 is disposed at a position spaced apart from the substrate 1 for packaging the semiconductor device, and made of an insulating material such as ceramic such that an electrode electrically connected to a gate terminal and a drain terminal of the semiconductor device through wiring is placed so as to be insulated.

The heat sink unit 3 is disposed on a lower side of the packaging block 2 and has a fluid movement region 310 disposed at a position corresponding to the through via hole 10 of the substrate 1 so as to communicate with the through via hole 10. Here, as well shown in FIGS. 3 and 5, the fluid movement region 310 refers to a region including an inflow region 311 and a discharge region 312 of the cooling fluid. That is, in the present embodiment, the cooling fluid may sequentially pass through the inflow region 311 and the flow channel 510 and discharge region 312 of the preform 4 inserted into the through via hole 10 of the substrate 1 so that the semiconductor device formed on the substrate 1 may be directly cooled with the cooling fluid.

The heat sink unit 3 may be formed of a single material, but in the present embodiment, includes a flow path forming body 32 with a flow path formed so as to smoothly form a flow path forming portion 320 and a cover member 31 coupled to the flow path forming body 32.

As well shown in FIG. 7, the metal thin film layer 5 includes a bonding portion 52 made of a conductive material and a direct cooling portion 51 formed integrally with the bonding portion 52. The bonding portion 52 is a portion disposed between the substrate 1 and the heat sink unit 3 for electrical connection and physical coupling therebetween, and the direct cooling portion 51 is conductively connected to the bonding portion 52, is formed in the through via hole 10 to enable electrical connection between the bonding portion 52 and the source terminal S, and is a portion in which the flow channel 510 communicating with the fluid movement region 310 of the heat sink unit 3 is formed.

The metal thin film layer 5 may be manufactured by using various methods, but is manufactured through a deposition process using gold (Au) to facilitate formation of a porous structure having excellent electrical properties and advantageous for boiling.

The direct cooling device for the integrated circuit according to an embodiment of the present disclosure having the configuration is configured to form the direct cooling portion 51 with the flow channel 510 through which the cooling fluid may flow in the through via hole 10 of the substrate 1 constituting the integrated circuit, and to couple the substrate 1 to the heat sink unit 3 through the bonding portion 52 formed integrally with the direct cooling portion 51, unlike the prior art (see FIG. 1) in which only a ground circuit is possible through the through via hole 10, which has the advantage of increasing product reliability due to improved thermal management efficiency of the integrated circuit by directly cooling the semiconductor device as well as the ground circuit, and the advantage of simplifying and miniaturizing the structure by implementing the cooling function using a circuit for grounding the semiconductor device even without forming an additional flow path structure for cooling the semiconductor device.

The direct cooling portion 51 of the metal thin film layer 5 has the porous structure so as to further improve the cooling efficiency by securing a large contact area with the cooling fluid and forming a structure favorable to boiling.

The present embodiment further includes the preform 4 disposed between the substrate 1 and the heat sink unit 3 to ensure smooth coupling therebetween.

For example, when the metal thin film layer 5 is deposited with gold (Au), and the heat sink unit 3 is coated with the same material, the preform 4 is made of an gold-tin (Au—Sn) alloy material and applies heat to couple the substrate 1 to the heat sink unit 3 through an eutectic bonding process.

The heat sink unit 3 employed in the present embodiment includes the flow path forming portion 320 in which the fluid movement region 310 is formed, and the flow path forming portion 320 may be formed in various structures that communicate with the flow channel 510 of the metal thin film layer 5, but as well shown in FIGS. 5 and 6, an inflow line 321 until the cooling fluid flows into the flow channel 510 of the metal thin film layer 5 and a discharge line 322 until the cooling fluid is discharged after flowing into the flow channel 510 are formed to be partitioned from each other in the flow path forming portion, so that a discharge path of the heated fluid by passing through the flow channel 510 and the inflow region 311 of a new fluid in a low temperature state into the flow channel 510 are distinguished, and thus improvement in the cooling efficiency may be expected.

The fluid movement region 310 located in a region corresponding to the flow channel 510 among the inflow line 321 and the discharge line 322 includes the inflow region 311 and the discharge region 312 that are partitioned from each other with a partition portion therebetween, as well shown in FIGS. 2 and 5.

Hereinafter, a method of manufacturing a direct cooling device for an integrated circuit, according to an embodiment of the present disclosure, will be described in detail with reference to FIG. 8.

Figure 8:
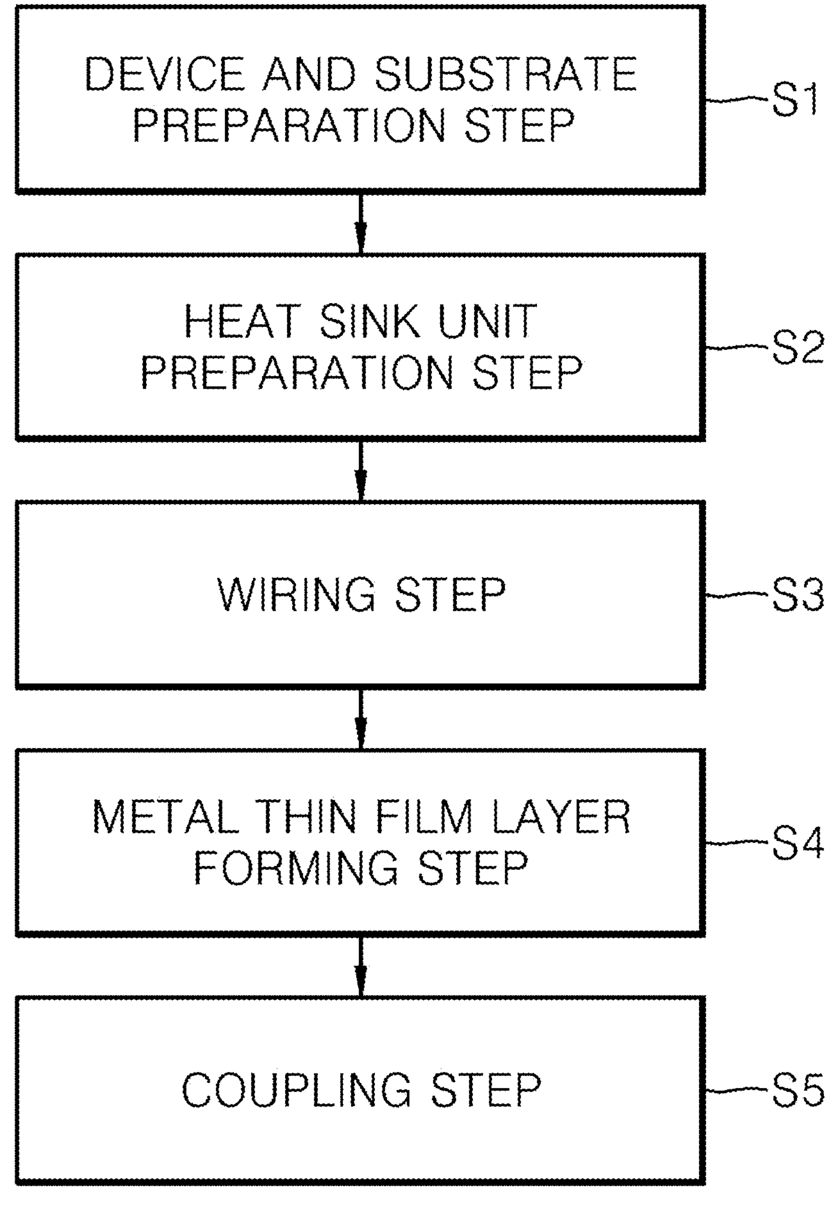
FIG. 8 is a block diagram for explaining the configuration of a method of manufacturing a direct cooling device for an integrated circuit, according to an embodiment of the present disclosure.

FIG. 8 is a block diagram for explaining the configuration of a method of manufacturing a direct cooling device for an integrated circuit, according to an embodiment of the present disclosure.

As shown in this figure, the method of manufacturing the direct cooling device for the integrated circuit employed in the present embodiment includes a device and substrate preparation step (S1), a heat sink unit preparation step (S2), a wiring step (S3), a metal thin film layer forming step (S4), and a coupling step (S5).

In the device and substrate preparation step (S1), a process of stacking a material layer for forming a semiconductor device on one side of the substrate 1 made of a material capable of manufacturing the semiconductor device, such as silicon, performing a semiconductor process on the material layer, forming the semiconductor device, and forming the through via hole 10 penetrating the one side and the other side located opposite to the one side so that the source terminal S of the semiconductor device is exposable to the other side is performed.

In the heat sink unit preparation step (S2), a process of disposing the heat sink unit 3 in which the fluid movement region 310 providing a movement path of a cooling fluid is formed on a lower side of the substrate 1 is performed. Here, the fluid movement region 310 may communicate with the through via hole 10 of the substrate 1 to allow the cooling fluid to flow into the through via hole 10.

In the wiring step (S3), a process of disposing the packaging block 22 in the heat sink unit 3 in the form that surrounds the substrate 1 for packaging the semiconductor device, and electrically connecting an electrode placed on the packaging block 2 to the semiconductor device is performed.

In the metal thin film layer forming step (S4), a process of forming the metal thin film layer 5 between the substrate 1 and the heat sink unit 3 for electrical connection and physical coupling between the substrate 1 and the heat sink unit 3 is performed. Specifically, in the step, a process of forming the bonding portion 52 of the metal thin film layer 5 between the substrate 1 and the heat sink unit 3, and forming, in the through via hole 10, the direct cooling portion 51 integrally formed the bonding portion 52 and in which the flow channel 510 communicating with the fluid movement region 310 of the heat sink unit 3 is formed is performed. Here, the metal thin film layer 5 may be implemented in various ways, but is implemented through a deposition process using gold (Au) to facilitate the formation of a porous structure having easy electrical properties and advantageous for boiling.

In the coupling step (S5), a process of coupling the substrate 1 to the heat sink unit 3 by coating metal on a side of the heat sink unit 3 opposite to the substrate 1 and then applying heat is performed.

The method of manufacturing the direct cooling device for the integrated circuit according to an embodiment of the present disclosure having the configuration includes the metal thin film layer forming step (S4) in which the direct cooling portion 51 with the flow channel 510 through which the cooling fluid may flow is formed in the through via hole 10 of the substrate 1 constituting the integrated circuit, and the bonding portion 52 formed integrally with the direct cooling portion 51 is disposed between the substrate 1 to the heat sink unit 3, and the metal thin film layer forming step (S4) is organically coupled to other components (device and substrate preparation step/heat sink unit preparation step/wiring step/coupling step), unlike the prior art in which only a ground circuit is possible through the through via hole 10, which has the advantage of increasing product reliability due to improved thermal management efficiency of the integrated circuit by directly cooling the semiconductor device as well as the ground circuit, the advantage of simplifying and miniaturizing the structure by implementing the cooling function using a circuit for grounding the semiconductor device even without forming an additional flow path structure for cooling the semiconductor device, and the advantage of being able to easily and precisely manufacture a package unit exhibiting these functions.

The coupling step (S5) includes an additional process to improve coupling strength between the substrate 1 and the heat sink unit 3. That is, the present embodiment includes a process of coating metal on the side of the heat sink unit 3 opposite to the substrate 1, before applying heat, disposing the preform 4 including the coated metal material, and then applying heat, to configured to couple the substrate 1 to the heat sink unit 3 by using the preform 4 through a eutectic bonding process.

Although various embodiments of the present disclosure have been described above, the present embodiment and the drawings attached to the present specification merely clearly present a part of the technical idea included in the present disclosure, and it will be obvious that all modifications and specific embodiments that may be easily inferred by those skilled in the art within the scope of the technical idea included in the specification and drawings of the present disclosure are included in the scope of the present disclosure.

| [EXPLANATION OF REFERENCE NUMERALS] | |
|---|---|
| 1: Substrate | 10: Through via hole |
| 2: Packaging block | 3: Heat sink unit |
| 31: Cover member | 310: Fluid movement region |
| 311: Inflow region | 312: Discharge region |
| 32: flow path forming body | 320: flow path forming portion |
| 321: Inflow line | 322: Discharge line |
| 4: Preform | 5: Metal thin film layer |
| 51: Direct cooling portion | 510: Flow channel |
| 52: Bonding portion | S: Source terminal |

What is claimed is:

1. A direct cooling device for an integrated circuit, the direct cooling device comprising:

a substrate made of a material capable of manufacturing a semiconductor device, having the semiconductor device formed on one side thereof through a semiconductor process formed, and comprising a through via hole formed by penetrating the one side and the other side located opposite to the one side so that a source terminal of the semiconductor device is exposable to the other side;

a packaging block disposed at a position spaced apart from the substrate for packaging the semiconductor device, and having an electrode electrically connected to a gate terminal and a drain terminal of the semiconductor device through wiring and placed thereon to be insulated;

a heat sink unit disposed on a lower side of the packaging block and having a fluid movement region formed at a position corresponding to the through via hole of the substrate; and a metal thin film layer comprising a bonding portion made of a conductive material and disposed between the substrate and the heat sink unit for electrical connection and physical coupling between the substrate and the heat sink unit, and a direct cooling portion conductively connected to the bonding portion, disposed in the through via hole to enable electrical connection between the bonding portion and the source terminal, and having a flow channel communicating with the fluid movement region of the heat sink unit.

2. The direct cooling device of claim 1, wherein the direct cooling portion of the metal thin film layer has a porous structure.

3. The direct cooling device of claim 1, further comprising a preform disposed between the metal thin film layer and the heat sink unit for coupling between the metal thin film layer and the heat sink unit.

4. The direct cooling device of claim 1, wherein the heat sink unit includes a flow path forming portion in which the fluid movement region is formed, and in the flow path forming portion, an inflow line until a cooling fluid flows into the flow channel of the substrate and a discharge line until the cooling fluid is discharged after flowing into the flow channel are formed to be partitioned from each other, so that the cooling fluid flowing into the inflow line is configured to pass through the flow channel of the metal thin film layer without being directly discharged to the discharge line, and the fluid movement region located in a region corresponding to the flow channel among the inflow line and the discharge line includes the inflow region and the discharge region that are partitioned from each other with a partition portion therebetween.

5. A method of manufacturing a direct cooling device for an integrated circuit, the method comprising:

a device and substrate preparation step of stacking a material layer for forming a semiconductor device on one surface of a substrate made of a material including silicon, performing a semiconductor process on the material layer, forming the semiconductor device, and forming a through via hole penetrating the one side and the other side located opposite to the one side so that a source terminal of the semiconductor device is exposable to the other side;

a heat sink unit preparation step of disposing a heat sink unit including a flow path forming portion in which a fluid movement region communicating with the through via hole of the substrate is formed on a lower side of the substrate;

a wiring step of disposing a packaging block in the heat sink unit in a form that surrounds the substrate for packaging the semiconductor device, and electrically connecting an electrode placed on the packaging block to a gate terminal and a drain terminal of the semiconductor device;

a metal thin film layer forming step of forming a metal thin film layer between the substrate and the heat sink unit for electrical connection and physical coupling between the substrate and the heat sink unit, forming a bonding portion of the metal thin film layer between the substrate and the heat sink unit, and forming, in the through via hole, a direct cooling portion integrally formed the bonding portion and in which a flow channel communicating with the fluid movement region of the heat sink unit is formed; and a coupling step of coupling the substrate to the heat sink unit by coating a side of the heat sink unit opposite to the substrate with metal and then applying heat.

6. The method of claim 5, wherein the coupling step includes a process of coating the metal on the side of the heat sink unit opposite to the substrate, before applying heat, disposing a preform including the coated metal material, and applying heat, to couple the substrate to the heat sink unit by using the preform through a eutectic bonding process.

7. The method of claim 5, wherein a direct cooling portion of the preform has a porous structure that facilitates heat dissipation.

* * * * *